(12) United States Patent
Butler et al.

(10) Patent No.: US 7,170,582 B2
(45) Date of Patent: Jan. 30, 2007

(54) SUPPORT DEVICE AND LIGHTOGRAPHIC APPARATUS

(75) Inventors: Hans Butler, Best (NL); Frank Auer, Valkenswaard (NL); Martinus Van Duijnhoven, Deurne (NL); Pieter Johannes Gertrudis Meijers, Horst (NL); Jan-Gerard Cornelis Van Der Toorn, Eindhoven (NL); Joost De Pee, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 78 days.

(21) Appl. No.: 11/009,549

(22) Filed: Dec. 13, 2004

(65) Prior Publication Data

US 2006/0126040 A1  Jun. 15, 2006

(51) Int. Cl.
*G03B 27/42* (2006.01)
(52) U.S. Cl. .............................. 355/53; 355/72; 355/75
(58) Field of Classification Search ...................... None
See application file for complete search history.

(56) References Cited

U.S. PATENT DOCUMENTS 6,816,232 B2 * 11/2004 Takahashi et al. ............ 355/53
6,953,109 B2 * 10/2005 Watson et al. ............... 188/378

* cited by examiner

*Primary Examiner*—D. Rutledge
(74) *Attorney, Agent, or Firm*—Pillsbury Winthrop Shaw Pittman, LLP

(57) ABSTRACT

To correctly transfer a pattern to a substrate, or transfer any other pattern having small features, a transfer of vibrations from an external support structure, e.g. a floor, is minimized by using a vibration isolation support device, e.g. an airmount. To improve the vibration isolation characteristics of the airmount, the (positive) stiffness of the airmount is lowered by providing a pressure reducer that is configured to reduce a gas pressure change in a gas chamber of the airmount, which pressure change is a result of a volume change of the gas chamber. Due to vibrations the volume of said gas chamber changes. Due to the stiffness reduction device, the corresponding pressure change, and thus a force exerted on the supported object, is reduced, thereby reducing the stiffness of the airmount.

36 Claims, 2 Drawing Sheets

SUPPORT DEVICE AND LIGHTOGRAPHIC APPARATUS

FIELD

The present invention relates to a support device and a lithographic apparatus comprising such a support device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that circumstance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The pattern to be transferred to the substrate may include very small structures. Any mechanical disturbance such as a vibration or the like may result in an erroneous transfer rendering the substrate unusable. To minimize a transfer of vibrations and other mechanical disturbances from any external structure, such as a support structure or floor, to the lithographic apparatus, in particular a substrate table, a pattern support structure and/or a projection system thereof, it is known to employ one or more vibration isolation support devices to support the lithographic apparatus.

Such a vibration isolation support device supports the lithographic apparatus, i.e., at least partly compensates a gravitational force exerted thereon. Thus, the vibration isolation support device provides a mechanical connection between the lithographic apparatus and an external structure, e.g., a floor. Depending on a frequency of the vibration, a vibration present in the external structure may be (partly) damped by the isolation support device and/or (partly) transferred from the external structure to the lithographic apparatus. The amount of damping and/or transfer of a vibration of a certain frequency depends on a stiffness of the vibration isolation support device. A relatively small stiffness results in relatively high vibration isolation. Therefore, it is desirable to have a vibration isolation support device having a small stiffness.

A well-known vibration isolation support device is an airmount. Such an airmount includes a gas chamber containing an amount of pressurized air and a moveable member partly positioned in the gas chamber. The pressure of the air exerts a support force on the moveable member. An object such as a lithographic apparatus, or a part thereof, is supported on the moveable member. The known airmount has such a (positive) stiffness that it is suitable to isolate vibrations above a predetermined frequency such that a pattern having a predetermined minimum feature size may be correctly transferred. However, there is a need to transfer smaller structures having smaller feature sizes and therefore, there is a need for a vibration isolation support device having a smaller stiffness.

SUMMARY

It is desirable to have a vibration isolation device having a small stiffness.

According to an embodiment of the invention, there is provided a vibration isolation support device for supporting a structure, the support device including a gas chamber assembly, the gas chamber assembly including: a gas chamber configured to contain an amount of gas under pressure for providing a support force; and a stiffness reduction device configured to reduce a gas pressure change in the gas chamber, which pressure change is a result of a volume change.

According to an embodiment of the invention, there is provided a lithographic apparatus arranged to transfer a pattern from a patterning device onto a substrate, wherein a vibration isolation support device supports at least one of a patterning device support structure and a substrate support structure, the vibration isolation support device including a gas chamber assembly, the gas chamber assembly including: a gas chamber configured to contain an amount of gas under pressure for providing a support force; and a stiffness reduction device configured to reduce a gas pressure change in the gas chamber, which pressure change is a result of a volume change.

The stiffness reduction device can be termed a "pressure variation reducer," since it reduces pressure in the gas chamber in order to reduce stiffness. It can also be termed a "pressure controller."

In an embodiment of the invention, there is provided a vibration isolation support device for supporting an object, including a gas chamber assembly, the gas chamber assembly including a gas chamber and a pressure controller, wherein the gas chamber is configured to contain an amount of gas under pressure for providing a support force; and the pressure controller is configured to reduce a gas pressure change in said gas chamber, which pressure change is a result of a volume change of the gas chamber.

A lithographic apparatus, in accordance with another embodiment of the invention, includes an illumination system configured to condition a beam of radiation; a patterning device support configured to support a patterning device, the patterning device configured to pattern the beam of radiation according to a desired pattern; a substrate support configured to hold a substrate; a projection system configured to project the patterned beam of radiation onto a target portion of the substrate, and a vibration isolation support device configured to support one of said supports, the vibration isolation support device including a gas chamber assembly, the gas chamber assembly including a gas chamber configured to contain an amount of gas under pressure for providing a support force; and a pressure controller configured to reduce a gas pressure change in the gas chamber, which pressure change is a result of a volume change of the gas chamber.

In yet another embodiment of the invention, there is provided a vibration isolation support for supporting an object in a manner that isolates vibrations from the object, including a gas chamber configured to contain gas under pressure; a movable member that is capable of slight movement relative to the gas chamber and that is supported by the gas under pressure; and a pressure controller that adjusts pressure in the chamber based on a change of volume in the chamber.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
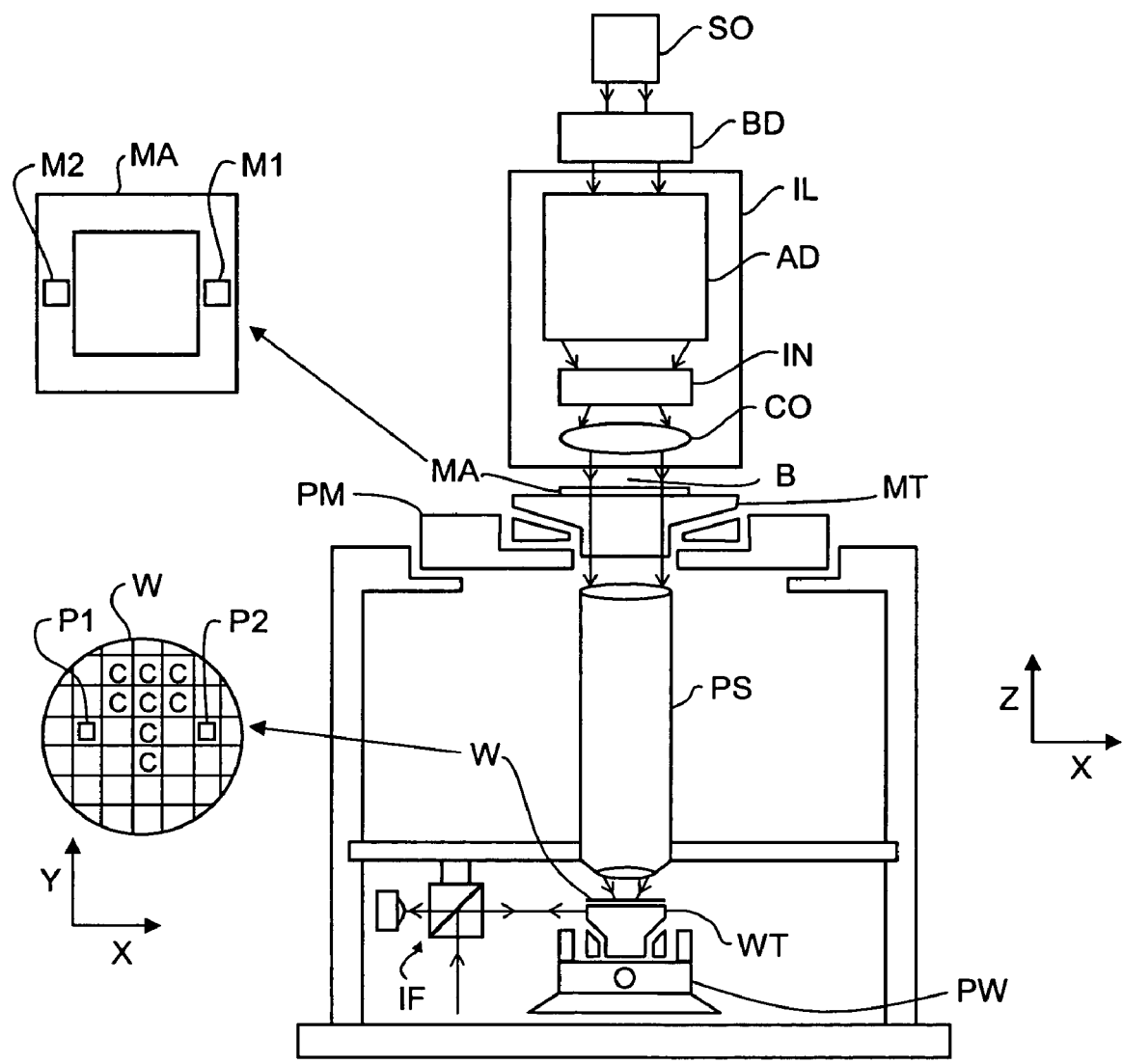
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation radiation) and a support structure or patterning device support (e.g. a mask table) MT constructed to support a patterning device (e.g. a mask) MA and connected to a first positioner PM configured to accurately position the patterning device in accordance with certain parameters. The apparatus also includes a substrate table or substrate support (e.g. a wafer table) WT constructed to hold a substrate (e.g. a resist-coated wafer) W and connected to a second positioner PW configured to accurately position the substrate in accordance with certain parameters, and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure or patterning device support supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure or patterning device support can use mechanical, vacuum, electrostatic or other clamping techniques to hold the patterning device. The support structure or patterning device support may be a frame or a table, for example, which may be fixed or movable as required. The support structure or patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table or substrate support WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table or patterning device support MT may be realized with the aid of a long-stroke module (coarse positioning) and a short-stroke module (fine positioning), which form part of the first positioner PM. Similarly, movement of the substrate table or substrate support WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. Step mode: the mask table or patterning device support MT and the substrate table or substrate support WT are kept essentially stationary, while an entire pattern imparted to the radiation beam is projected onto a target portion C at once (i.e. a single static exposure). The substrate table or substrate support WT is then shifted in the X and/or Y direction so that a different target portion C can be exposed. In step mode, the maximum size of the exposure field limits the size of the target portion C imaged in a single static exposure.

2. Scan mode: the mask table or patterning device support MT and the substrate table or substrate support WT are scanned synchronously while a pattern imparted to the radiation beam is projected onto a target portion C (i.e. a single dynamic exposure). The velocity and direction of the substrate table or substrate support WT relative to the mask table or patterning device support MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. Another mode: the mask table or patterning device support MT is kept essentially stationary holding a programmable patterning device, and the substrate table or substrate support WT is moved or scanned while a pattern imparted to the radiation beam is projected onto a target portion C. In this mode, generally a pulsed radiation source is employed and the programmable patterning device is updated as required after each movement of the substrate table or substrate support WT or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

Figure 2:
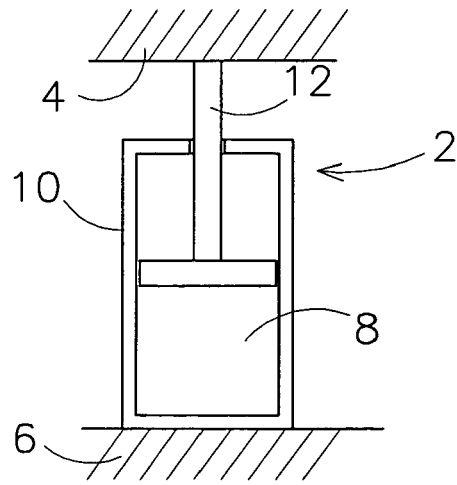
FIG. 2 depicts a conventional airmount, i.e. a vibration isolation support device having a gas chamber assembly.

FIG. 2 schematically illustrates a conventional airmount 2 for supporting an object 4 such as a lithographic apparatus or a part thereof. The airmount 2 is supported on a floor 6, but may as well be supported by any other suitable structure. The airmount 2 contains an amount of gas 8, e.g. air, in a gas chamber formed by gas chamber walls 10 and a moveable member 12, which may move with respect to the gas chamber walls 10. Due to the pressure in the gas 8, a force is exerted on the moveable member 12. This force may be employed to compensate a gravitational force exerted on the object 4.

If the floor 6 vibrates, i.e. exerts a time-dependent force on the gas chamber wall 10, the gas chamber wall 10 attempts to move with respect to the moveable member 12, resulting in a change of the volume containing the gas 8. A volume change results in a pressure change and thus in a change of the force exerted on the moveable member 12. Thus, the vibration of the floor 6 may (partly) be transferred to the object 4. A transfer ratio is, inter alia, dependent on the frequency of the vibration and on the stiffness of the airmount 2. According to embodiments of the present invention, the airmount 2 may be designed such that its stiffness is reduced.

Figure 3:
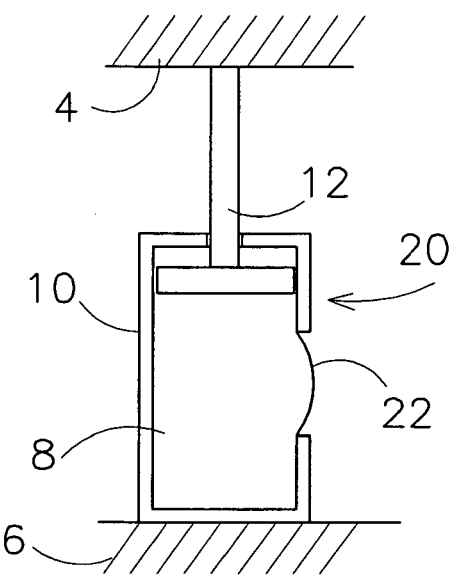
FIG. 3 depicts an airmount according to an embodiment of the present invention.

FIG. 3 schematically illustrates an airmount 20 according to an embodiment of the present invention. The airmount 20 contains the above-mentioned amount of gas 8 between gas chamber walls 10 and a moveable member 12, thereby providing a support force between an object 4 and a floor 6. The airmount 20 is provided with a flexible membrane 22 in the gas chamber walls 10. The shape of the membrane 22 depends on a pressure inside the gas chamber and on a pressure outside of the gas chamber. If the pressure inside the gas chamber increases, the membrane 22 moves outwardly. Thus, the volume of the gas chamber is increased, thereby at least partly compensating that pressure increase. If the pressure inside the gas chamber decreases, the membrane 22 moves inwardly. Thus, the volume of the gas chamber is decreased, thereby at least partly compensating that pressure decrease. Thus, the membrane 22 effectively reduces the influence of a vibration exerted on the gas chamber walls 10. The stiffness of the airmount 20 is thus effectively reduced.

The membrane 22 may be pre-stressed, i.e. a predetermined tension may be present on the membrane 22, when the airmount 20 supporting the object 4 is in a steady state. Thus, the membrane 22 will more easily stretch under influence of a pressure change, thereby further lowering the stiffness of the airmount 20.

In an embodiment of the invention the ratio of the stiffness of the membrane ($K_{membrane}$) and the surface area of the membrane ($A_{membrane}$) is equal to the ratio of the stiffness of the airmount ($K_{airmount}$) and the surface area of the moveable member or the airmount ($A_{airmount}$) are equal ($K_{membrane}/A_{membrane}=K_{airmount}/A_{airmount}$). Thus, a disturbance as a result of a pressure change outside the airmount is minimized.

Figure 4:
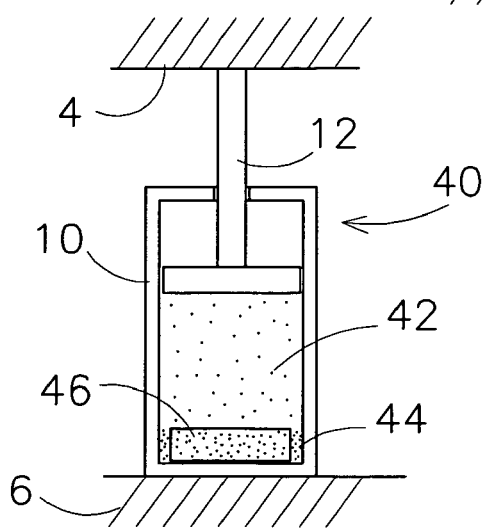
FIG. 4 depicts an airmount according to an embodiment of the present invention.

FIG. 4 schematically illustrates an airmount 40 according to another embodiment of the present invention. The gas chamber formed by walls 10 and moveable member 12 comprises a fluid 44 at least partly filling the gas chamber, the gas chamber further containing a corresponding saturated fluid damp 42. Thus, phase transitions between gas and fluid occur due to pressure variations, thereby decreasing the resulting pressure change. Similarly, a fluid may be used, which fluid may contain an amount of gas, resulting in equilibrium between an amount of gas and an amount of gas contained in that fluid. An embodiment includes a member having a large surface positioned in the gas chamber, e.g. a sponge. Such a member having a large surface eases the transitions from gas to fluid, and vice versa.

A fluid 44 and fluid damp 42 present in the gas chamber advantageously stimulates an isothermal process of volume change, as opposed to an adiabatic process. Since the temperature of the gas, fluid 44 and fluid damp 42 does not change in an isothermal process, the pressure of the gas does not change due to any temperature change. It is noted that if the process is not isothermal, transfer of generated heat may be improved by employing a suitable material for the wall of the gas chamber, the material having suitable thermal characteristics such as a high heat transfer coefficient.

In an embodiment of the invention, the gas chamber may be provided with a structure including a material having a high heat transfer coefficient, that structure being in thermal contact with the outside of the gas chamber in order to generate an improved heat transfer between the inside of the gas chamber and the outside thereof, thereby reducing a pressure change due to a temperature change as mentioned above.

In an embodiment of the invention, the gas chamber may be provided with a structure including a material having a high heat capacity in order to generate a heat exchange between the gas inside the gas chamber and that structure, when the temperature of the gas changes. Due to the high heat capacity and the heat exchange between the material and the gas, the temperature change of the gas is reduced and, therefore, a pressure change due to that temperature change is reduced.

Figure 5:
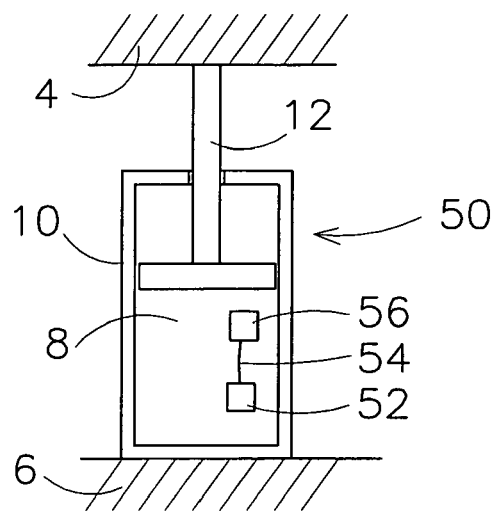
FIG. 5 depicts an airmount according to an embodiment of the present invention.

FIG. 5 schematically illustrates a further embodiment including a feedback control loop for actively reducing a gas pressure change in the gas chamber of the airmount 50. The airmount 50 is provided with a sensor 52, an actuator system 56 and a suitable connection 54 therebetween for operatively coupling the sensor 52 and the actuator system 56.

The sensor 52 may be a pressure sensor and the actuator system 56 may be an actuator system suitable for controlling a pressure of a gas. If the sensor 52 senses a pressure change inside the airmount 50, the actuator system 56 may, in response, control the pressure to be constant.

The sensor 52 may be a distance sensor for sensing a distance between the moveable member 12 and an opposite wall 10 of the gas chamber. That distance is a measure for the volume of the gas chamber and a change in the distance is a measure for a volume change of the gas chamber. As mentioned above, the actuator system 56 may be an actuator system suitable for controlling a pressure of a gas in the gas chamber directly or indirectly. For example, the actuator system 56 may control a temperature of the gas, thereby indirectly controlling the pressure. As well, the actuator system 56 may be suitable for controlling a volume directly. For example, the actuator system 56 may include a piezoelement or another actuator for changing the volume of the gas chamber. In another exemplary embodiment, the control system may actively vaporize a fluid present in the gas chamber, as illustrated in and described in relation to FIG. 4 in order to stimulate vaporization when necessary to reduce a pressure change.

Figure 6:
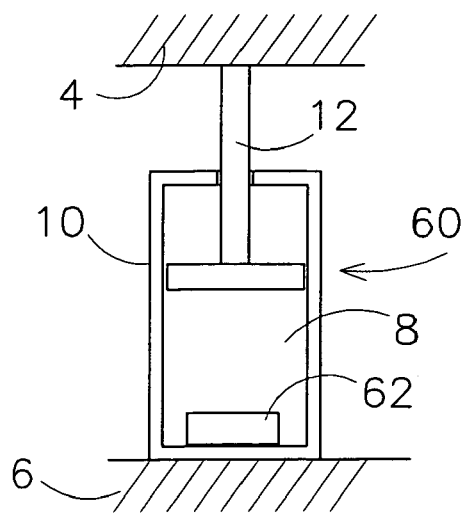
FIG. 6 depicts an airmount according to an embodiment of the present invention.

FIG. 6 schematically illustrates an airmount 60 according to an embodiment of the present invention, wherein a gravity compensation force is not provided by a static gas pressure only. An actuator system 62 provides an upward gas stream providing a upward force on the moveable member 12. The gravity compensation force may be controlled by controlling the actuator system 62, for example using a feedback circuit as shown in FIG. 5. For example, the actuator system 62 may be a fan for stimulating an airflow or may be a water jet for providing a water stream, or any other suitable actuator system It is noted that the devices for reducing the stiffness of the airmount described above in relation to FIGS. 3–6 may be provided in any combination to obtain a desired stiffness of the airmount.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A vibration isolation support device for supporting an object, comprising a gas chamber assembly, the gas chamber assembly including a gas chamber and a pressure controller, wherein
    said gas chamber is configured to contain an amount of gas under pressure for providing a support force; and
    said pressure controller is configured to reduce a gas pressure change in said gas chamber, which pressure change is a result of a volume change of said gas chamber.

2. The vibration isolation support device according to claim 1, wherein said pressure controller comprises a flexible membrane positioned in a wall of said gas chamber.

3. The vibration isolation support device according to claim 2, wherein said membrane is pre-stressed.

4. The vibration isolation support device according to claim 2, further comprising a moveable member that is slideably moveable in said gas chamber and on which said support force is exerted, wherein a ratio of a stiffness of the membrane and a surface area of the membrane is substantially equal to a ratio of a stiffness of said support device and a surface area of said moveable member on which said support force is exerted.

5. The vibration isolation support device according to claim 1, wherein the pressure controller comprises a control system having a feedback control loop configured to actively control pressure in said chamber.

6. The vibration isolation support device according to claim 5, further comprising a sensor that is configured to determine a volume of the gas chamber and to output a corresponding sensor signal, the feedback control loop being configured to control the volume of the gas chamber in response to said sensor signal.

7. The vibration isolation support device according to claim 5, further comprising a pressure sensor that is configured to determine a pressure in the gas chamber and to output a corresponding sensor signal, the feedback control loop being configured to control the pressure in said gas chamber.

8. The vibration isolation support device according to claim 7, wherein the pressure in said gas chamber is controlled by controlling a temperature of said gas contained in said gas chamber.

9. The vibration isolation support device according to claim 1, wherein the gas chamber is provided with a structure comprising a material having a relatively high heat transfer coefficient, said structure being in thermal contact with the outside of the gas chamber.

10. The vibration isolation support device according to claim 1, wherein the gas chamber is provided with a structure comprising a material having a relatively high heat capacity.

11. A vibration isolation support device for supporting an object, comprising a gas chamber assembly, the gas chamber assembly including a gas chamber and a pressure controller, wherein
    said gas chamber is configured to contain an amount of gas under pressure for providing a support force; and
    said pressure controller is configured to reduce a gas pressure change in said gas chamber, which pressure change is a result of a volume change of said gas chamber,
    wherein said pressure controller comprises a fluid at least partly filling the gas chamber, said gas chamber further containing a corresponding saturated fluid damp.

12. The vibration isolation support device according to claim 11, wherein said pressure controller comprises a member having a large surface positioned in said gas chamber.

13. The vibration isolation support device according to claim 12, wherein said member having a large surface is a sponge.

14. A lithographic apparatus comprising:
    (a) an illumination system configured to condition a beam of radiation;
    (b) a patterning device support configured to support a patterning device, the patterning device configured to pattern the beam of radiation according to a desired pattern;
    (c) a substrate support configured to hold a substrate;
    (d) a projection system configured to project the patterned beam of radiation onto a target portion of the substrate, and
    (e) a vibration isolation support device configured to support one of said supports, the vibration isolation support device comprising a gas chamber assembly, the gas chamber assembly comprising:
        (i) a gas chamber configured to contain an amount of gas under pressure for providing a support force; and
        (ii) a pressure controller configured to reduce a gas pressure change in said gas chamber, which pressure change is a result of a volume change of said gas chamber.

15. The lithographic apparatus according to claim 14, wherein said pressure controller comprises a flexible membrane positioned in a wall of said gas chamber.

16. The lithographic apparatus according to claim 15, wherein said membrane is pre-stressed.

17. The lithographic apparatus according to claim 15, wherein said vibration isolation support device comprises a moveable member that is slideably moveable in said gas chamber and on which said support force is exerted, wherein a ratio of a stiffness of the membrane and a surface area of the membrane is substantially equal to a ratio of a stiffness of said support device and a surface area of said moveable member on which said support force is exerted.

18. The lithographic apparatus according to claim 14, wherein the pressure controller comprises a control system having a feedback control loop configured to actively control pressure in said chamber.

19. The lithographic apparatus according to claim 18, wherein the vibration isolation support device includes a sensor that is configured to determine a volume of the gas chamber and to output a corresponding sensor signal, the feedback control loop being configured to control the volume of the gas chamber in response to said sensor signal.

20. The lithographic apparatus according to claim 18, wherein a vibration isolation support device includes a pressure sensor that is configured to determine a pressure in the gas chamber and to output a corresponding sensor signal, the feedback control loop being configured to control the pressure in said gas chamber.

21. The lithographic apparatus according to claim 20, wherein the pressure in said gas chamber is controlled by controlling a temperature of said gas contained in said gas chamber.

22. The lithographic apparatus according to claim 14, wherein the gas chamber is provided with a structure comprising a material having a high heat transfer coefficient, said structure being in thermal contact with the outside of the gas chamber.

23. The lithographic apparatus according to claim 14, wherein the gas chamber is provided with a structure comprising a material having a relatively high heat capacity.

24. The lithographic apparatus according to claim 14, wherein said one support is the substrate.

25. The lithographic apparatus according to claim 14, wherein said one support is the patterning device.

26. The lithographic apparatus according to claim 14, further comprising an additional vibration isolation support device configured to support the other one of said supports such that both said patterning device support and substrate support are supported by a respective vibration isolation support device that includes a gas chamber assembly, the gas chamber assembly including:
   (i) a gas chamber configured to contain an amount of gas under pressure for providing a support force; and
   (ii) a pressure controller configured to reduce a gas pressure change in said gas chamber, which pressure change is a result of a volume change of said gas chamber.

27. A lithographic apparatus comprising:
   (a) an illumination system configured to condition a beam of radiation:
   (b) a patterning device support configured to support a patterning device, the patterning device configured to pattern the beam of radiation according to a desired pattern;
   (c) a substrate support configured to hold a substrate;
   (d) a projection system configured to project the patterned beam of radiation onto a target portion of the substrate, and
   (e) a vibration isolation support device configured to support one of said supports, the vibration isolation support device comprising a gas chamber assembly, the gas chamber assembly comprising:
      (i) a gas chamber configured to contain an amount of gas under pressure for providing a support force; and
      (ii) a pressure controller configured to reduce a gas pressure change in said gas chamber, which pressure change is a result of a volume change of said gas chamber,
   wherein said pressure controller comprises a fluid at least partly filling the gas chamber, said gas chamber further containing a corresponding saturated fluid damp.

28. The lithographic apparatus according to claim 27, wherein said pressure controller comprises a member having a large surface positioned in said gas chamber.

29. The lithographic apparatus according to claim 28, wherein said member having a large surface is a sponge.

30. A vibration isolation support for supporting an object in a manner that isolates vibrations from the object, comprising:
   a gas chamber configured to contain gas under pressure;
   a movable member that is capable of slight movement relative to said gas chamber and that is supported by said gas under pressure; and
   a pressure controller that adjusts pressure in said chamber based on a change of volume in said chamber.

31. The vibration isolation support device according to claim 30, wherein said pressure controller comprises a flexible membrane positioned in a wall of said gas chamber.

32. The vibration isolation support device according to claim 30, wherein said pressure controller comprises a member having a large surface positioned in said gas chamber.

33. The vibration isolation support device according to claim 32, wherein said member having a large surface is a sponge.

34. The vibration isolation support device according to claim 30, wherein the pressure controller comprises a control system having a feedback control loop configured to actively control pressure in said chamber.

35. The vibration isolation support device according to claim 30, wherein the pressure in said gas chamber is controlled by controlling a temperature of said gas contained in said gas chamber.

36. A vibration isolation support device for supporting an object in a manner that isolates vibrations from the object, comprising:
   a gas chamber configured to contain gas under pressure;
   a movable member that is capable of slight movement relative to said gas chamber and that is supported by said gas under pressure; and
   a pressure controller that adjusts pressure in said chamber based on a change of volume in said chamber, wherein said pressure controller comprises a fluid at least partly filling the gas chamber, said gas chamber further containing a corresponding saturated fluid damp.

* * * * *

UNITED STATES PATENT AND TRADEMARK OFFICE
CERTIFICATE OF CORRECTION

PATENT NO. : 7,170,582 B2  Page 1 of 1
APPLICATION NO. : 11/009549
DATED : January 30, 2007
INVENTOR(S) : Hans Butler et al.

It is certified that error appears in the above-identified patent and that said Letters Patent is hereby corrected as shown below:

The Title, item (54)

replace "SUPPORT DEVICE AND LIGHTOGRAPHIC APPARATUS" with --SUPPORT DEVICE AND LITHOGRAPHIC APPARATUS--

Signed and Sealed this

Thirty-first Day of July, 2007

JON W. DUDAS
*Director of the United States Patent and Trademark Office*